(12) United States Patent
Elms et al.

(10) Patent No.: US 6,850,073 B2
(45) Date of Patent: Feb. 1, 2005

(54) POWER CIRCUIT TESTER APPARATUS AND METHOD

(75) Inventors: Robert T. Elms, Monroeville, PA (US); Brendan A. Foley, Allison Park, PA (US); Kevin L. Parker, Pittsburgh, PA (US)

(73) Assignee: Eaton Corporation, Cleveland, OH (US)

( * ) Notice: Subject to any disclaimer, the term of this patent is extended or adjusted under 35 U.S.C. 154(b) by 148 days.

(21) Appl. No.: 10/382,940

(22) Filed: Mar. 6, 2003

(65) Prior Publication Data

US 2004/0174173 A1 Sep. 9, 2004

(51) Int. Cl.⁷ .................. G01R 31/14; G01R 31/327
(52) U.S. Cl. ........................... 324/509; 324/424
(58) Field of Search .................. 324/509, 424, 324/528, 523, 536; 361/42, 44, 45, 52

(56) References Cited

U.S. PATENT DOCUMENTS

| | | |
|---|---|---|
| 4,144,487 A | 3/1979 | Pharney |
| 5,224,006 A | 6/1993 | MacKenzie et al. |
| 5,459,630 A | 10/1995 | MacKenzie et al. |
| 5,546,266 A | 8/1996 | Mackenzie et al. |
| 5,642,052 A | 6/1997 | Earle |
| 5,691,869 A | 11/1997 | Engel et al. |
| 6,072,317 A | 6/2000 | Mackenzie |
| 6,084,756 A | 7/2000 | Doring et al. |
| 6,128,169 A | 10/2000 | Neiger et al. |
| 6,218,844 B1 | 4/2001 | Wong et al. |
| 6,262,871 B1 | 7/2001 | Nemir et al. |
| 6,560,079 B1 * | 5/2003 | Hirsh et al. ............ 361/42 |
| 2003/0090271 A1 * | 5/2003 | Hurwicz ............ 324/424 |

OTHER PUBLICATIONS www.munroelectric.com/catalog/greenlee/circuit.html; "Circuit Tracer Application Guide", pp. 2–4, Feb. 15, 2002.
GREENLEE, "Circuit Testers, Locators, and Tracers", pp. 40–45, 2002.
Fox Meter, Inc., "AS1000—Arc Smart", 1 p., 2003.
www.arcfaulttester.com/specs.html, Fox Meter Inc., "FOX", 1 p., Jan. 23, 2003.
Eaton I Cutler–Hammer, "Important Safety Instructions for Installing Circuit Breaker Also Listed as Branch/Feeder Arc Fault Circuit Interrupter (AFCI)", 1 p., 1999.

* cited by examiner

*Primary Examiner*—N. Le
*Assistant Examiner*—Amy He
(74) *Attorney, Agent, or Firm*—Martin J. Moran

(57) ABSTRACT

A circuit analyzer tests a power circuit including an earth leakage ground fault circuit interrupter, a receptacle, and a line, a neutral and a ground electrically connected between the circuit interrupter and the receptacle. The circuit analyzer includes a plurality of pushbuttons for inputting a plurality of test requests. A microprocessor outputs a plurality of test signals responsive to the test requests. A plurality of load circuits selectively provide a load between the line and the neutral responsive to one of the test signals. A display confirms tripping of the ground fault circuit interrupter responsive to the load, in order to determine if the neutral is electrically connected to the ground between the circuit interrupter and the receptacle.

25 Claims, 7 Drawing Sheets

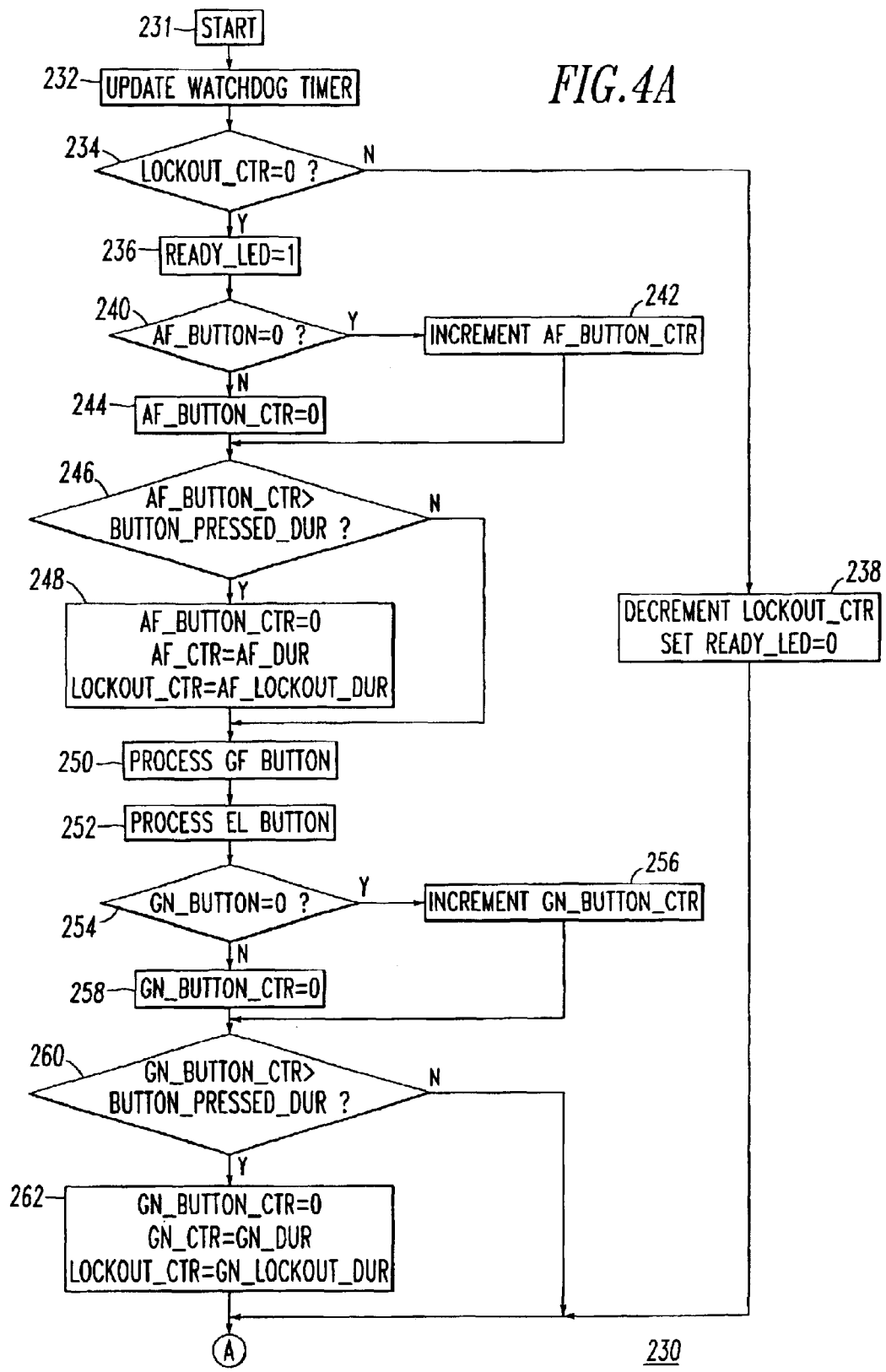

POWER CIRCUIT TESTER APPARATUS AND METHOD

BACKGROUND OF THE INVENTION

1. Field of the Invention

This invention relates to apparatus for testing power circuits and, more particularly, to devices for testing power circuits including ground fault and/or arc fault circuit interrupters. The invention also relates to a method for testing a power circuit including a ground fault circuit interrupter.

2. Background Information

The common type of circuit breaker used for residential, commercial, and light industrial applications has an electromechanical thermal-magnetic trip device to provide an instantaneous trip in response to a short circuit and a delayed trip in response to persistent overcurrent conditions. Some of these circuit breakers include ground fault protection, which trips the ground fault circuit interrupter (GFCI) in response to a line-to-ground fault, and in some cases, a neutral-to-ground fault. Ground fault protection is provided by an electronic circuit which is set to trip at about 4 to 6 mA of ground fault current for people protection, and at about 30 mA for equipment (or earth leakage) protection. It is known to incorporate a test circuit in the circuit breaker, which tests at least portions of the electronic ground fault trip circuit.

It is also known to test for improper wiring connections (i.e., line and ground being reversed; line and neutral being reversed; ground being open; excessive ground resistance; neutral being open; line being open). Test circuits for this purpose are commercially available.

Although test circuits and devices for testing for improper wiring connections are known, there is room for improvement in the variety of tests that are performed.

Recently, there has been rising interest in also protecting power distribution circuits, and particularly the branch circuits for homes, commercial and light industrial applications, from arc faults. Arc faults are intermittent, high impedance faults, which can be caused for instance by worn or damaged insulation, loose connections, broken conductors and the like. Arc faults can occur in the permanent wiring, at receptacles, or more likely, in the wiring of loads or extension cords plugged into a receptacle. Because of the intermittent and high impedance nature of arc faults, they do not generate currents of sufficient instantaneous magnitude or sufficient average current to trigger the thermal-magnetic trip device which provides the short circuit and overcurrent protection.

Various types of arc fault detectors have been developed and/or proposed. Generally, the detectors are of two types. One type responds to the random high frequency noise content of the current waveform generated by an arc. This high frequency noise tends to be attenuated, especially by the presence of filters on some loads, which can be connected to the branch circuit. The other basic type of arc fault detector responds to the step increase in current occurring as the arc is repetitively and randomly struck. Examples of arc fault detectors of the latter type are disclosed in U.S. Pat. Nos. 5,224,006; and 5,691,869.

U.S. Pat. No. 5,459,630 discloses several forms of built-in test circuits for arc fault detectors. In one embodiment, in which the arc fault detector utilizes a coil to sense current, the test circuit adds a capacitor which forms with the impedance of the coil an oscillator generating a waveform with an amplitude which simulates the rapid rise of a step change in current produced by an arc. In another embodiment, the user must repetitively close a switch, which connects a resistor between the line conductor and neutral, to again generate large amplitude pulses.

While the built-in arc fault and ground fault testers test the response of the electronic circuits to simulated conditions, they do not necessarily indicate whether the device will adequately respond in a real installation. One difficulty is that the circuit breaker containing the detectors is located at a load center together with the circuit breakers for other circuits in the installation. However, the fault condition can occur anywhere downstream and can be further distanced from the circuit breaker and detectors by an extension cord. The wiring, and particularly the extension cord, can insert considerable resistance between the fault and the detector, which attenuates the signal sensed by the detector. When the effects of this resistance are combined with the low amplitude of the currents generated by these faults, the detectors may not have sufficient sensitivity to detect remote faults. Another problem can arise when a receptacle is not connected as intended.

Detection of an arc fault is complicated by the fact that some normal loads can produce waveforms similar to arc faults. Arc fault detectors attempt to distinguish over such phenomena to minimize nuisance faults. The task is further complicated by the fact that, as mentioned above, arc faults tend to be smaller in amplitude than dead faults. Furthermore, arc faults tend to be relatively intermittent.

With the introduction of arc fault circuit interrupter (AFCI) devices, such as arc fault circuit breakers, there exists the need for a method and apparatus for reliably determining if one of three types of circuit interrupters (i.e., AFCI, GFCI for people protection, and GFCI for equipment protection) is attached to the power circuit.

This is complicated by the fact that, unlike GFCI devices, different AFCI devices from different manufacturers have different responses to arc fault waveforms. For example, test arc fault waveforms of a particular pulse width and a particular current magnitude may require a different number of cycles or pulses in which to trip such different AFCI devices. In other words, test arc fault waveforms of a particular pulse width, a particular current magnitude and a particular count of pulses may trip some, but not all, of those different AFCI devices.

A known AFCI tester applies twelve 400 $\mu$S half-cycle pulses at 112A peak current.

There is room for improvement in AFCI tester apparatus and methods.

SUMMARY OF THE INVENTION

These needs and others are met by the present invention, which detects shared ground and neutral connections in a power circuit.

The invention also provides an arc fault test, which is suitable for a wide range of AFCI devices available from a wide range of manufacturers.

As one aspect of the invention, an apparatus for testing a power circuit including an earth leakage ground fault circuit interrupter, a receptacle, and a line, a neutral and a ground electrically connected between the circuit interrupter and the receptacle, comprises: means for inputting at least one test request; means for outputting at least one test signal responsive to the at least one test request; means for selectively providing a load between the line and the neutral responsive to one of the at least one test signal; and a display confirming tripping of the ground fault circuit interrupter responsive to the load, in order to determine if the neutral is electrically connected to the ground between the circuit interrupter and the receptacle.

The one of the at least one test signal may be a first test signal, and the means for outputting may include means for disabling a second test signal for a predetermined time after output of the first test signal. The power circuit may include an alternating current waveform having a plurality of line cycles, and the means for outputting may include means for outputting the one of the at least one test signal for a predetermined count of the line cycles.

The predetermined time may be about two seconds. The predetermined count may be about four line cycles.

The means for selectively providing may include an impedance providing about a 0.25 ampere load between the line and the neutral.

As another aspect of the invention, an apparatus for testing a power circuit including an arc fault circuit interrupter, a receptacle, and a line and a neutral electrically connected between the circuit interrupter and the receptacle, comprises: means for inputting at least one test request; means for outputting at least one test signal responsive to the at least one test request, one of the at least one test signal having about eight to about twelve pulses, the pulses having a pulse width of about 700 μS to about 1000 μS; means for selectively providing a load between the line and the neutral responsive to the one of the at least one test signal, the load providing a current of about 65 to about 140 peak amperes; and a display confirming tripping of the arc fault circuit interrupter responsive to the load and the one of the at least one test signal.

As another aspect of the invention, a method for testing a power circuit including an earth leakage ground fault circuit interrupter, a receptacle, and a line, a neutral and a ground electrically connected between the circuit interrupter and the receptacle, with the receptacle receiving a line-to-neutral voltage from the circuit interrupter, comprises: inputting at least one test request; outputting at least one test signal responsive to the at least one test request; selectively providing a load between the line and the neutral responsive to one of the at least one test signal; and determining loss of the line-to-neutral voltage from the circuit interrupter responsive to the load, in order to determine that the neutral is electrically connected to the ground between the circuit interrupter and the receptacle.

BRIEF DESCRIPTION OF THE DRAWINGS

A full understanding of the invention can be gained from the following description of the preferred embodiments when read in conjunction with the accompanying drawings in which:

FIGS. 4A–4B are a flowchart of an interrupt service routine executed by the microprocessor of FIG. 2B.

DESCRIPTION OF THE PREFERRED EMBODIMENTS

As employed herein, the term "terminal" shall expressly include, but not be limited to, any suitable device attached to the end of a wire, a cable, a conductor or an electrical apparatus (e.g., receptacle, outlet, circuit interrupter) for making an electrical connection (e.g., a compression terminal, a stab, a wire pigtail).

As employed herein, the term "ground fault test" refers to a people protection (e.g., about 4 to about 8 mA) ground fault test.

As employed herein, the term "earth leakage test" refers to an equipment protection (e.g., about 30 mA to about 40 mA) ground fault test.

Figure 1:
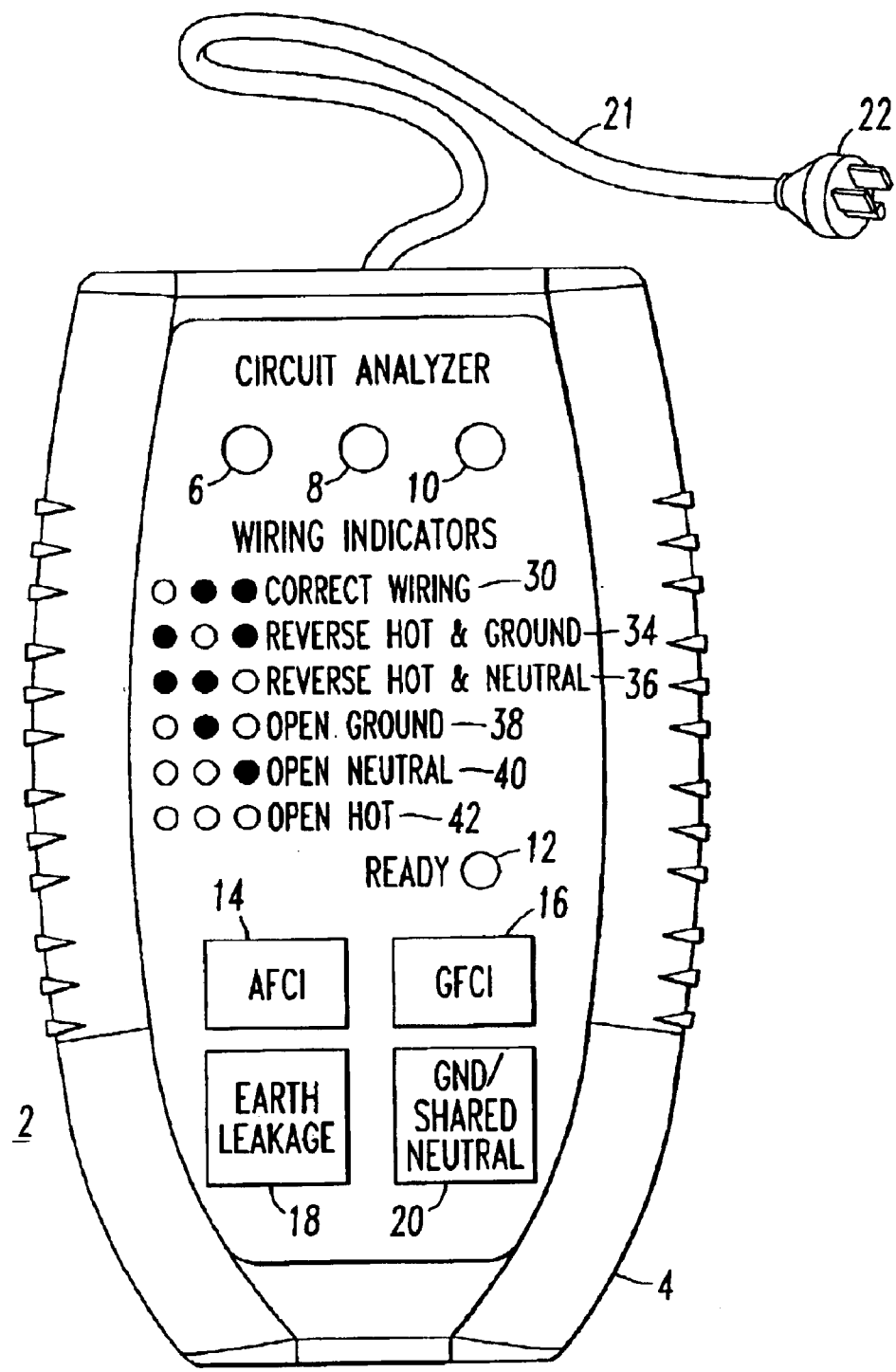
FIG. 1 is a plan view of a circuit analyzer in accordance with the present invention.

Referring to FIG. 1, a circuit analyzer 2 includes a housing 4, three wiring indicator LEDs 6,8,10, a ready LED 12, and four pushbuttons 14,16,18,20. The circuit analyzer 2 also includes a conventional line cord 21 having a three-terminal plug 22 for electrical connection with the line (L) 24, neutral (N) 26 and ground (G) 28 conductors of a power circuit 29 through a receptacle (R) 31.

Referring to FIGS. 1 and 2A–2C, the LEDs 6,8,10 display a state 30 (i.e., LED 6 off, and LEDs 8,10 on) for correct wiring and power in the power circuit 29 between the receptacle 31 at one end and a circuit interrupter 32, such as a circuit breaker (CB), at the other end thereof. The LEDs 6,8,10 also display states 34,36,38,40,42 (as shown in FIG. 1) for incorrect wiring in the power circuit 29. These incorrect states include the first state 34 for the line 24 and the ground 28 being reversed between the circuit interrupter 32 and the receptacle 31, the second state 36 for the line 24 and the neutral 26 being reversed between the circuit interrupter 32 and the receptacle 31, the third state 38 for the ground 28 being open between the circuit interrupter 32 and the receptacle 31 the fourth state 40 for the neutral 26 being open between the circuit interrupter 32 and the receptacle 31, and the fifth state 42 for the line 24 being open between the circuit interrupter 32 and the receptacle 31.

The four pushbuttons include the AFCI pushbutton 14 for initiating an arc fault test request, the GFCI pushbutton 16 for initiating a ground fault (people protection) test request, the EARTH LEAKAGE pushbutton 18 for initiating an earth leakage test (ground fault equipment protection), and the GND/SHARED NEUTRAL pushbutton 20 for initiating a shared ground/neutral test for the power circuit 29.

The ready LED 12 is illuminated whenever any one of the four tests associated with the four pushbuttons 14,16,18,20 is available for initiation, and is extinguished whenever any one of those four tests is in progress.

Figure 2A:
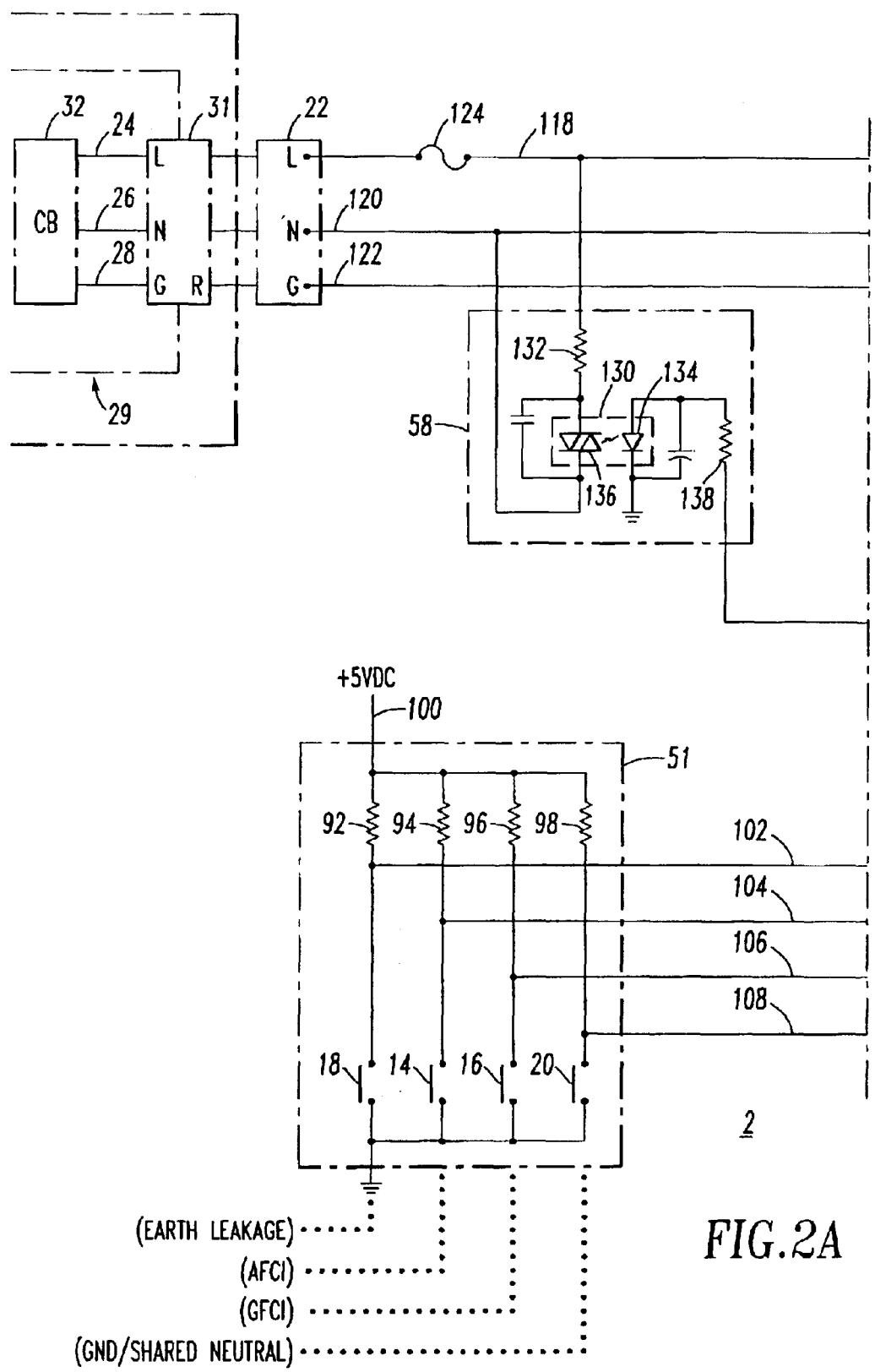
FIGS. 2A–2C, when placed side by side, form a block diagram in schematic form of the circuit analyzer of FIG. 1.
Figure 2B:
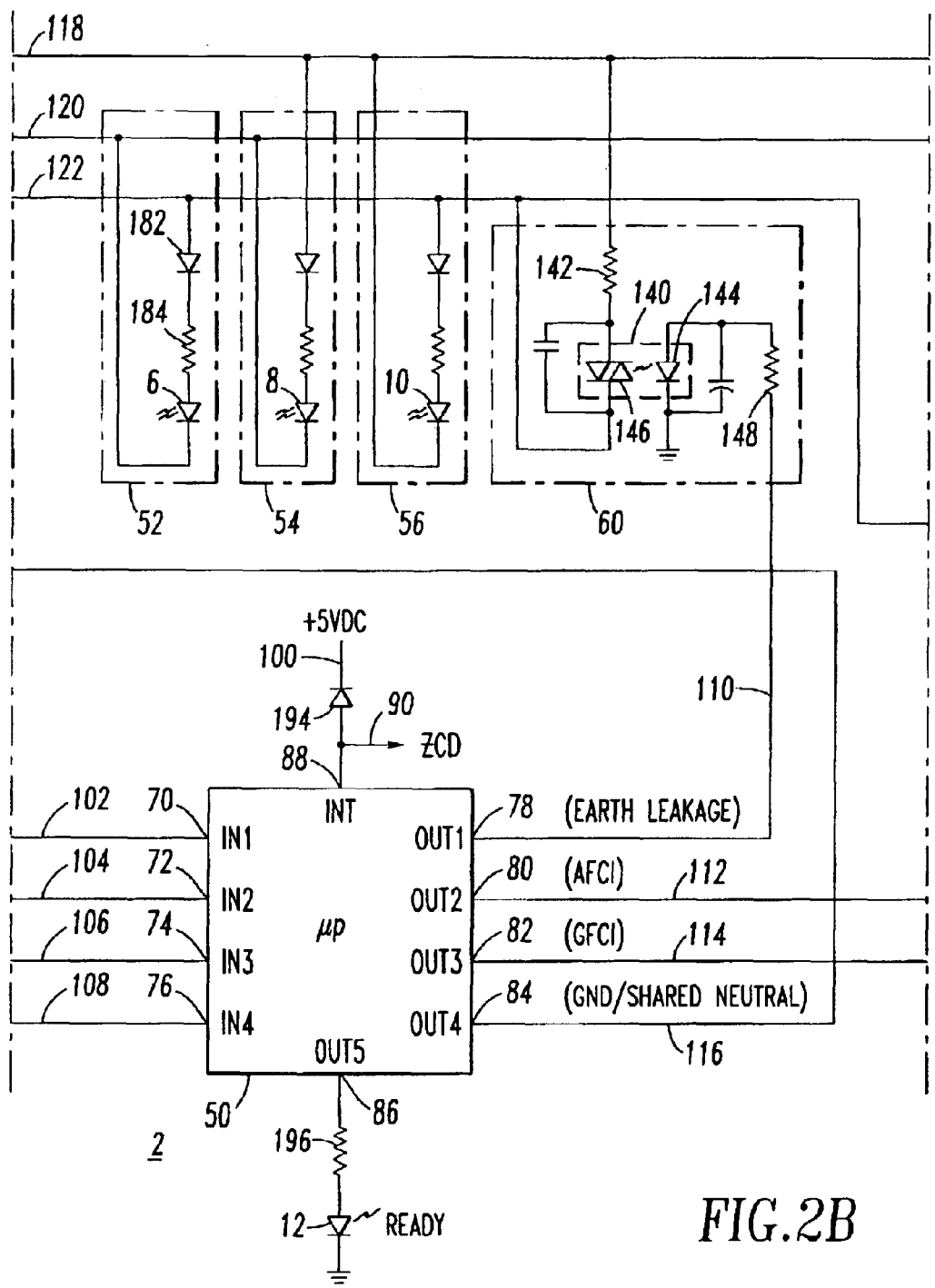
Figure 2C:
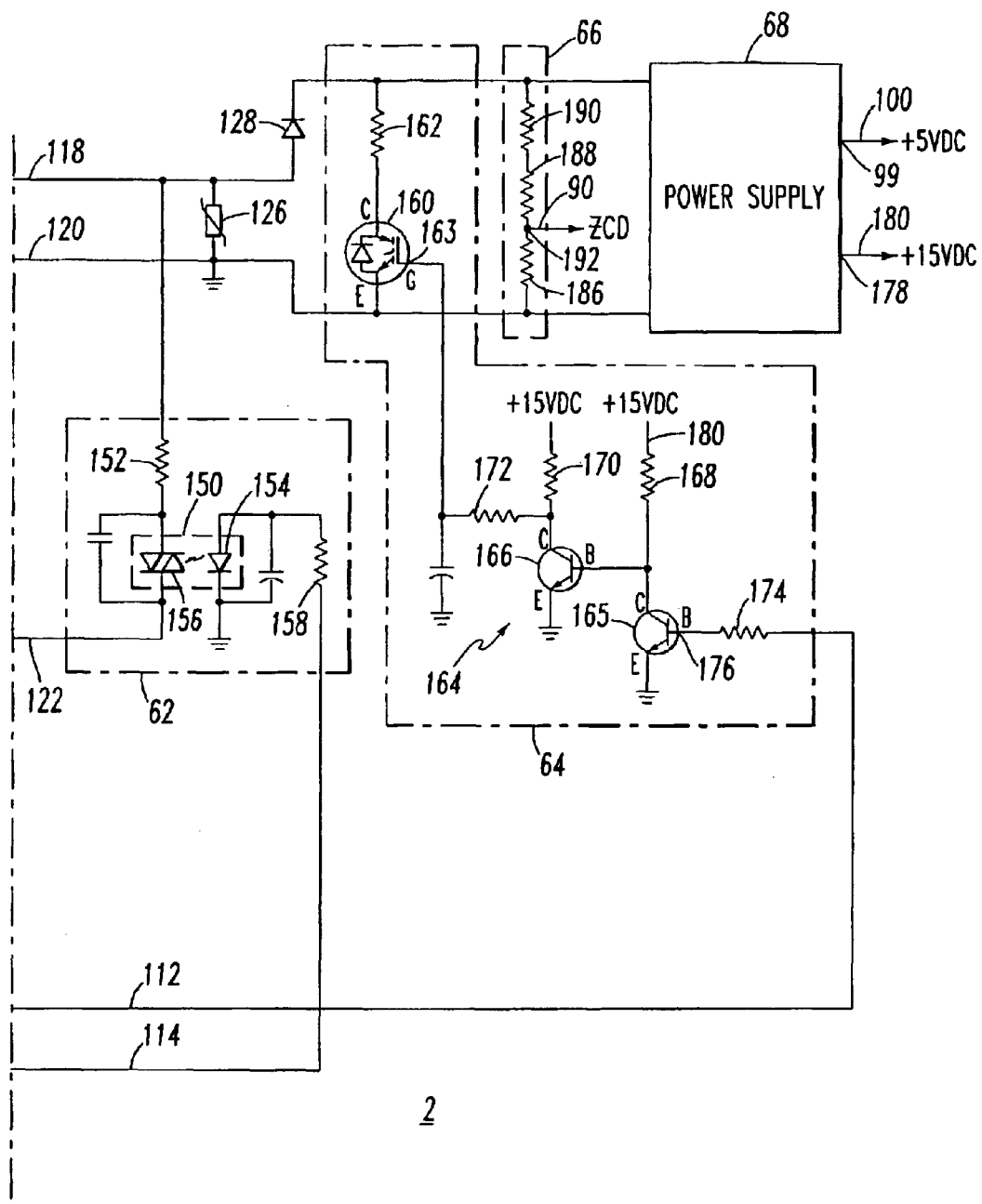

FIGS. 2A–2C show the circuit analyzer 2, which includes a microprocessor (μP) 50, an input circuit 51 having the pushbuttons 14,16,18,20 of FIG. 1, three display circuits 52,54,56 having the respective LEDs 6,8,10 of FIG. 1, four load circuits 58,60,62,64 corresponding to the pushbuttons 20,18,16,14, respectively, a zero crossing detector circuit 66, and a power supply 68. The μP 50 includes a plurality of digital inputs (IN1,IN2,IN3,IN4) 70,72,74,76, a plurality of digital outputs (OUT1,OUT2,OUT3,OUT4,OUT5) 78,80, 82,84,86, and an interrupt input (INT) 88 having a zero crossing detection (ZCD) signal 90.

The power circuit 29 (shown in phantom line drawing) includes an alternating current waveform having a plurality of line cycles (e.g., without limitation, 50 Hz, 60 Hz, 400 Hz). The receptacle 31 receives a line-to-neutral voltage (e.g., without limitation, a nominal 120 $VAC_{RMS}$ line voltage) from the circuit interrupter 32.

The input circuit 51 includes four pull-up resistors 92,94, 96,98, which are electrically connected together at one end to a first output 99 of the power supply 68 having a +5VDC voltage 100, and at other end are individually electrically connected to the pushbuttons 18,14,16,20, respectively. The input circuit 51, in turn, provides four low-true test request signals 102,104,106,108 to the respective digital inputs 70,72,74,76 of the μP 50. Although pushbuttons 14,16,18,20 are shown, the invention is applicable to any suitable input hardware and/or software for inputting one or more test requests (e.g., without limitation, switches, entry fields, voice input, touch input, mouse, trackball, touch screen).

Figure 3:
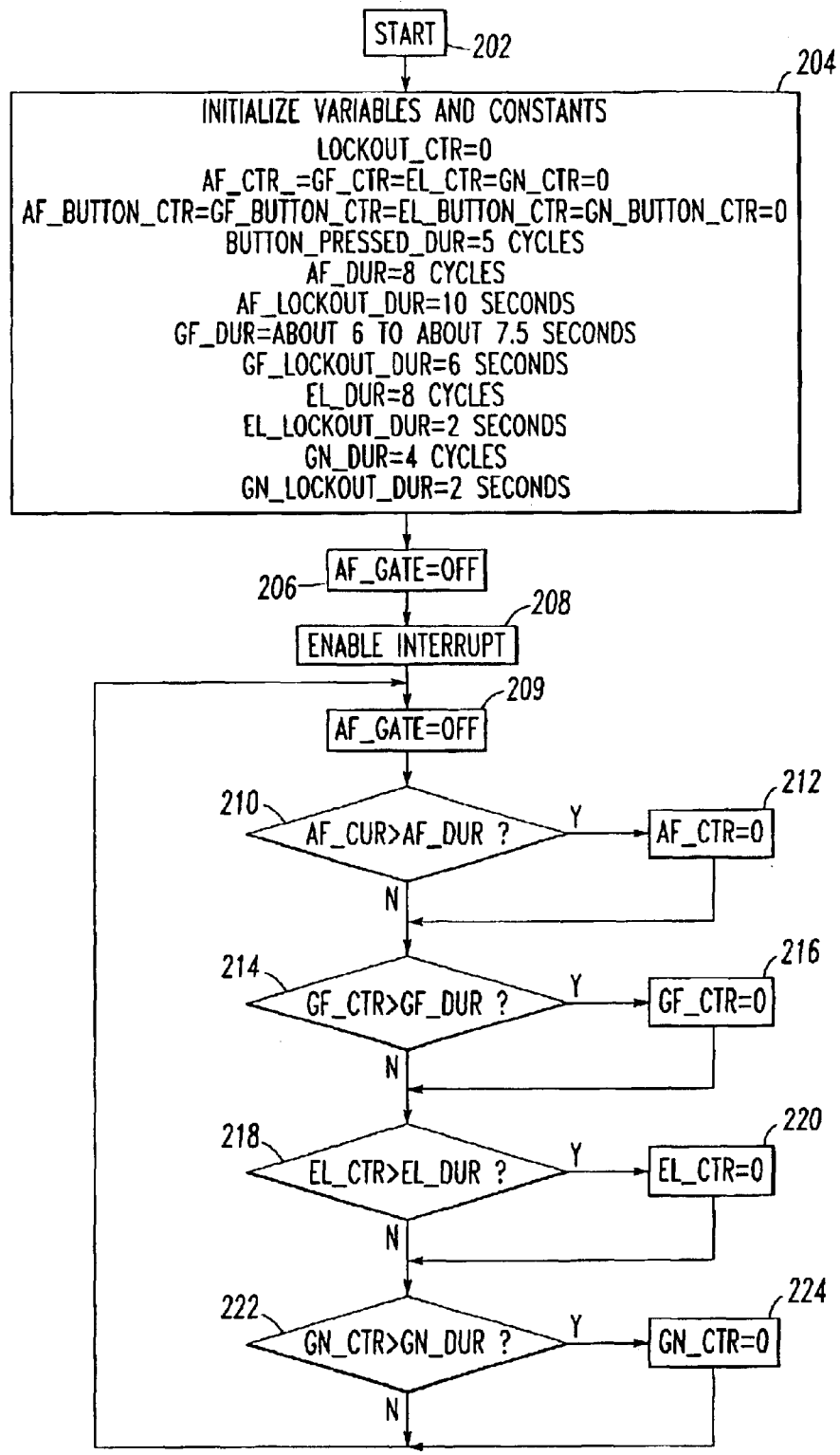
FIG. 3 is a flowchart of a startup and main loop routine executed by the microprocessor of FIG. 2B.

As discussed below in connection with FIGS. 3 and 4A–4B, the μP 50 outputs one or more test signals 110,112, 114,116 responsive to the test requests 102,104,106,108, respectively. In accordance with the invention, the test signal 116 for the ground/shared neutral test (GND/SHARED NEUTRAL) is set for about four power line cycles.

The load circuit 58 selectively provides a load between a local line conductor 118 and a local neutral conductor 120 of the circuit analyzer 2 responsive to the test signal (GND/SHARED NEUTRAL) 116. In a similar fashion, the load circuits 60 and 62 selectively provide loads between the local line conductor 118 and local ground conductor 122 of the circuit analyzer 2 responsive to the test signals (EARTH LEAKAGE) 110 and (GFCI) 114, respectively. The local conductors 120 and 122 are electrically connected to the power circuit neutral 26 and power circuit ground 28, respectively, by the receptacle 31 and plug 22. The local conductor 118 is preferably electrically connected to the power circuit line 24 by the receptacle 31 and plug 22 through a fuse 124. A suitable voltage transient suppression device, such as MOV 126, is preferably electrically connected between the local line and neutral conductors 118, 120. A diode 128 is electrically connected between the local line conductor 118 and the power supply 68, in order to provide positive half-cycle pulses of current thereto. The load circuit 64 selectively provides a load through the diode 128 between the local line conductor 118 and the local neutral conductor 120 of the circuit analyzer 2 responsive to the test signal (AFCI) 112.

The load circuit 58 includes an optically isolated triac 130 and a suitable impedance, such as resistor 132. The optically isolated triac 130 includes an input photo-diode 134 and an output triac 136. The triac 136 is electrically connected in series with the resistor 132 between the local line and neutral conductors 118,120. The photo-diode 134 and, thus, the triac 136, are responsive to the test signal 116, which is applied from the μP output 84 through a resistor 138. In accordance with the invention, the resistor 132 is selected to provide about a 0.25 A load between the local line and neutral conductors 118,120 when the test signal 116 is active. Although power circuit ground and neutral are conventionally electrically connected upstream of a circuit interrupter, in the event that the power circuit neutral 26 and ground 28 are improperly electrically connected downstream of the circuit interrupter 32, then at least a portion of the 0.25 A load is shared in the power circuit neutral 26 and ground 28. For example, if only about 12% (i.e., about 30 mA) of that load is carried by the ground 28, and if the circuit interrupter 32 is an equipment protection circuit GFCI, then such circuit breaker should trip and identify the shared ground and neutral wiring fault. Similarly, if only about 2.4% (i.e., about 6 mA) of that load is carried by the ground 28, and if the circuit interrupter 32 is a people protection circuit GFCI, then such circuit breaker should trip and identify the shared ground and neutral wiring fault.

The load circuit 60, which provides the ground fault earth leakage test (equipment protection), includes an optically isolated triac 140 and a suitable impedance, such as resistor 142. The optically isolated triac 140 includes an input photo-diode 144 and an output triac 146. The triac 146 is electrically connected in series with the resistor 142 between the local line and ground conductors 118,122. The photo-diode 144 and, thus, the triac 146, are responsive to the test signal 110, which is applied from the μP output 78 through a resistor 148. In the exemplary embodiment, the triac 146 and the resistor 142 provide a load of about 40 mA for the earth leakage test.

In a similar manner, the load circuit 62, which provides the ground fault test (people protection), includes an optically isolated triac 150 and a resistor 152. The optically isolated triac 150 includes an input photo-diode 154 and an output triac 156. The triac 156 is electrically connected in series with the resistor 152 between the local line and ground conductors 118,122. The photo-diode 154 and, thus, the triac 156, are responsive to the test signal 114, which is applied from the μP output 82 through a resistor 158. In the exemplary embodiment, the triac 156 and the resistor 152 provide a load of about 8 mA for the ground fault test (people protection).

The load circuit 64, which provides the arc fault test, includes a transistor 160 electrically connected in series with a resistor 162 and the diode 128 between the local line and neutral conductors 118,120. The gate 163 of the transistor 160 is turned on by a gate drive circuit 164 including NPN transistors 165,166 having collector pull-up resistors 168, 170, respectively, and also including a gate resistor 172 and an input resistor 174, which is electrically connected between the base 176 of transistor 165 and the μP output 80. The transistor 165, and thus the transistors 166,160, are responsive to the test signal (AFCI) 112. The pull-up resistors 168,170 are electrically connected to a second output 178 of the power supply 68 having a +15 VDC voltage 180. In accordance with the invention, the transistor 160 and the resistor 162 preferably provide a peak current load of about 65 A to about 140 A (based upon line impedance), with about 100 A being preferred.

As shown with the display circuit 52, each of the display circuits 52,54,56 is formed from the series combination of a diode 182, a resistor 184 and the corresponding one of the LEDs, such as 6. As discussed above in connection with FIG. 1, the LEDs 6,8,10 may be employed to display correct (e.g., state 30, which shows that the line 24, the neutral 26 and the ground 28 are properly electrically connected between the circuit interrupter 32 and the receptacle 31) and incorrect (e.g., even states 34–42) electrical connections between the circuit interrupter 32 and the receptacle 31. For example, the state 42 of FIG. 1 (i.e., all LEDs 6,8,10 off) confirms tripping of a GFCI responsive to the load provided by the load circuit 58, in order to determine loss of line-to-neutral voltage from the circuit interrupter 32 responsive to that load, thereby determining that the neutral 26 is electrically connected to the ground 28 between such GFCI and the receptacle 31, or confirms proper tripping of an AFCI responsive to the arc fault test load provided by the load circuit 64. Accordingly, the circuit analyzer 2 may be advantageously employed for testing the power circuit 29 for one or both of AFCI and/or GFCI circuit breakers, such as 32.

The zero crossing detector circuit 66 is a divider circuit including the series combination of resistors 186,188,190. The node 192 between the resistors 186,188 is electrically connected to the μP interrupt input 88, in order to provide the ZCD signal 90 thereto. Preferably, a diode 194 is employed to protect that input 88 from an overvoltage condition.

The μP output 86 drives the ready LED 12 through a resistor 196.

Referring to FIGS. 2A–2C and 3, the startup and main loop routine 200 of the µP 50 first starts, at 202, and then initializes pertinent variables and constants at 204. Next, at 206, the signal 112 of the output 80 of FIG. 2B is set off as a safety precaution. Then, at 208, the interrupt input 88 is enabled. At 209, the signal 112 of the output 80 of FIG. 2B is set off as a safety precaution. At 210, it is determined if the variable AF_CTR is greater than the predetermined constant AF_DUR. If so, then the variable AF_CTR is reset to zero at 212. Otherwise, or after 212, it is determined, at 214, if the variable GF_CTR is greater than the predetermined constant GF_DUR. If so, then the variable GF_CTR is reset to zero at 216. Otherwise, or after 216, it is determined, at 218, if the variable EL_CTR is greater than the predetermined constant EL_DUR. If so, then the variable EL_CTR is reset to zero at 220. Otherwise, or after 220, it is determined, at 222, if the variable GN_CTR is greater than the predetermined constant GN_DUR. If so, then the variable GN_CTR is reset to zero at 224. Otherwise, or after 224, step 209 is repeated. For example, step 204 sets the arc fault test duration (AF_DUR) to 8 line cycles, and the shared ground/neutral test duration (GN_DUR) to 4 line cycles. Also, step 204 sets the arc fault test lockout duration (AF_LOCKOUT_DUR) to 10 seconds (e.g., 600 cycles at 60 Hz), and the shared ground/neutral test lockout duration (GN_LOCKOUT_DUR) to 2 seconds (e.g., 120 cycles at 60 Hz). Those durations are employed by the interrupt service routine 230 of FIG. 4A, to disable or lockout other tests for that time duration following the completion of the corresponding test.

Referring to FIGS. 2A–2C and 4A, the interrupter service routine 230 is started, at 231, in response to the zero to one transition of the ZCD signal 90. Next, at 232, a watchdog timer (not shown) is updated. For example, the watchdog timer may reset the µP 50 if it is not updated for a few lines cycles. Next, at 234, it is determined if the variable LOCKOUT_CTR is equal to zero. If so, then the output 86 is set to illuminate the ready LED 12. Otherwise, at 238, the variable LOCKOUT_CTR is decremented and the output 86 is reset to extinguish the ready LED 12.

After 236, even steps 240–248 process the test request signal 104 from the pushbutton 14. At 240, if the low-true test request signal (AF_BUTTON) 104 is zero (i.e., true or active), then the corresponding button counter variable (AF_BUTTON_CTR) is incremented at 242. Otherwise, that variable (AF_BUTTON_CTR) is reset to zero at 244. After either 242 or 244, it is determined if that variable (AF_BUTTON_CTR) is greater than the button pressed duration constant (BUTTON_PRESSED_DUR) at 246. If so (e.g., the button was pressed a suitable duration, such as 5 line cycles or executions of the routine 230), then, at 248, the variable (AF_BUTTON_CTR) is reset to zero, the variable AF_CTR is set equal to the constant AF_DUR, and the variable LOCKOUT_CTR is set equal to the constant AF_LOCKOUT_DUR.

Otherwise, if the button was not pressed for a suitable duration, or after 248, steps 250 and 252 process the test request signals 106 and 102 for the pushbuttons 16 and 18, respectively, in a similar manner as even steps 240–248.

After 252, at 254, even steps 254–262 process the test request signal 108 from the pushbutton 20. At 254, if the low-true test request signal (GN_BUTTON) 108 is zero, then the corresponding button counter variable (GN_BUTTON_CTR) is incremented at 256. Otherwise, that variable (GN_BUTTON_CTR) is reset to zero at 258. After either 256 or 258, it is determined if that variable (GN_BUTTON_CTR) is greater than the button pressed duration constant (BUTTON_PRESSED_DUR) at 260. If so, then, at 262, the variable (GN_BUTTON_CTR) is reset to zero, the variable GN_CTR is set equal to the constant GN_DUR, and the variable LOCKOUT_CTR is set equal to the constant GN_LOCKOUT_DUR.

Figure 4B:
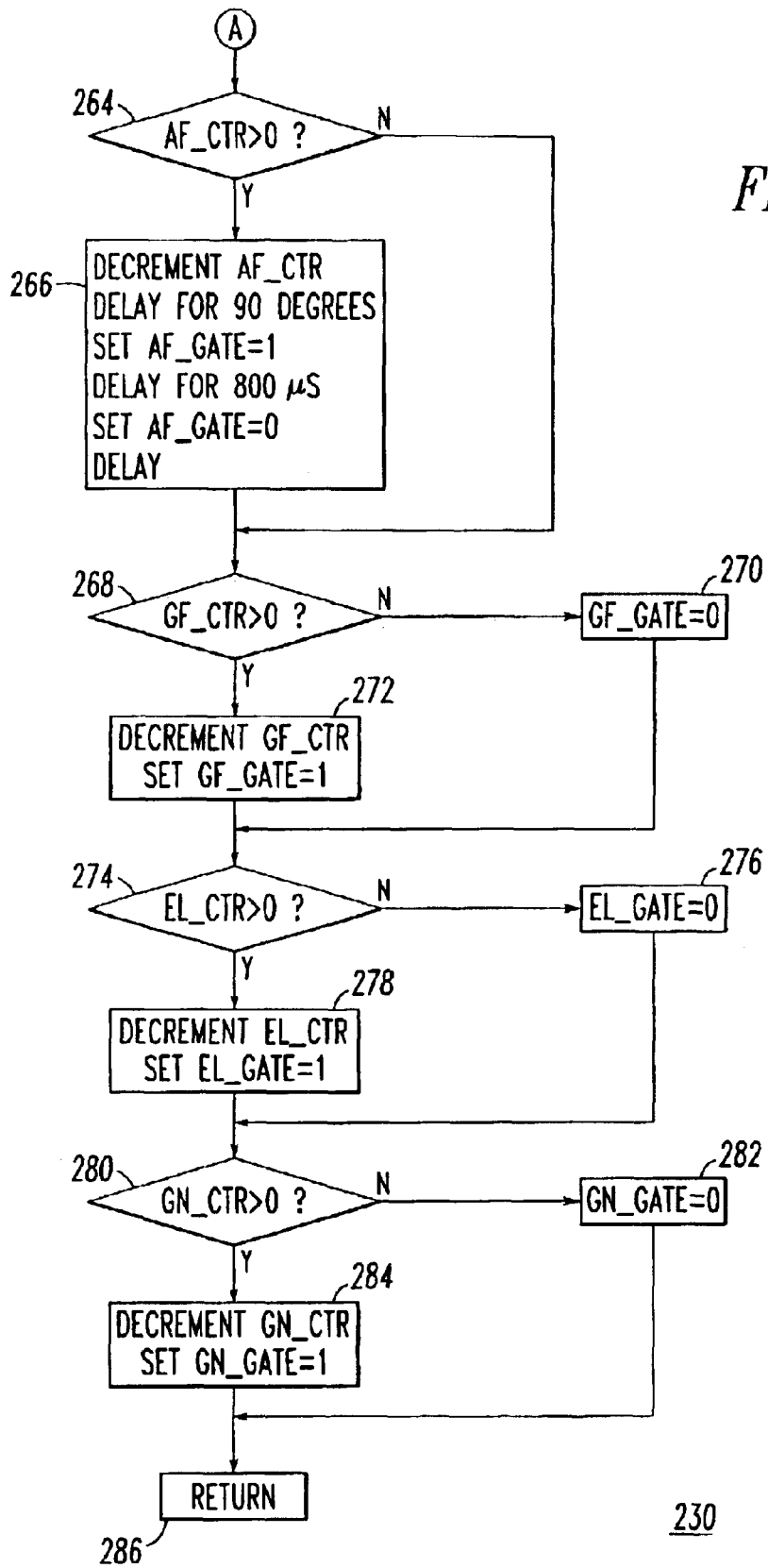

If the variable (GN_BUTTON_CTR) is not greater than the button pressed duration constant at 260, or after 238 or 262, execution resumes at step 264 of FIG. 4B. At 264, it is determined if the variable (AF_CTR) is greater than zero. If so, then the arc fault test is in progress and step 266 outputs the next arc fault test pulse through the load circuit 64. Step 266, which is suitably synchronized with the routine 230 and with the line-to-neutral positive zero crossing by the ZCD signal 90 at the interrupt input 88, decrements the variable (AF_CTR), delays for 90 degrees (i.e., ¼ of the line cycle, in order to be at about the time of the peak voltage for the positive half-cycle), sets the output 80 and the test signal 112, delays for about 800 µS, resets the output 80 and the test signal 112, and delays for a suitable period in order to wait until the current in the transistor 160 is zero and any consequential line voltage transients have ceased.

If the variable (AF_CTR) is zero at 264 or after 266, even steps 268–272 process a ground fault test (people protection). At 268, it is determined if the variable (GF_CTR) is greater than zero. If so, then the ground fault test is in progress and step 272 decrements the variable (GF_CTR) and sets, or maintains set, the output 82 and the test signal 114. Otherwise, if the variable (GF_CTR) is zero at 268, then the output 82 and the test signal 114 are reset at 270. For example, for the exemplary time of about 6 to about 7.5 seconds (GF_DUR) of step 204 of FIG. 3, this outputs the test signal 114 for a predetermined time (e.g., about 360 to about 450 line cycles at 60 Hz).

After steps 270 or 272, even steps 274–278 process an earth leakage test (equipment protection). At 274, it is determined if the variable (EL_CTR) is greater than zero. If so, then the earth leakage test is in progress and step 278 decrements the variable (EL_CTR) and sets, or maintains set, the output 78 and the test signal 110. Otherwise, if the variable (EL_CTR) is zero at 274, then the output 78 and the test signal 110 are reset at 276.

After steps 276 or 278, even steps 280–84 process the shared ground/neutral test. At 280, it is determined if the variable (GN_CTR) is greater than zero. If so, then the shared ground/neutral test is in progress and step 284 decrements the variable (GN_CTR) and sets, or maintains set, the output 84 and the test signal 116. Otherwise, if the variable (GN_CTR) is zero at 280, then the output 84 and the test signal 116 are reset at 282.

After steps 282 or 284, the routine 230 returns to the main loop, at 286.

For an arc fault test with, for example, 500 µS pulses repeated every 60 Hz half-cycle for nine half-cycles, five different AFCI devices from four different manufacturers trip at 37 A, 42 A, 46 A, 80 A and 82 A peak current, respectively. It is believed that further variability in such peak current occurs as the pulse width is decreased to, for example, 400 µS or a shorter pulse width. Hence, unless the peak current from a tester, such as the exemplary circuit analyzer 2, is suitably increased to cover all of those AFCI devices, then such a tester employing, say, eight 500 µS pulses at 80 A peak current, may not reliably detect the presence of an AFCI device, such as the circuit interrupter 32, having the 82 A peak current threshold for that particular pulse width and pulse count.

It is believed that as the pulse width is increased to about 800 µS, a more uniform trip characteristic is seen for the various AFCI devices from different manufacturers. For example, with 800 µS pulses repeated every 60 Hz cycle for eight cycles, as output by the exemplary circuit analyzer 2, the same five different AFCI devices from four different manufacturers trip at 65 A peak current in 4–8 cycles, and at 100 A peak current in 4–6 cycles. Accordingly, better uniformity of arc fault tripping across known AFCI devices is believed to occur with the exemplary arc fault test waveform of about 700 µS to about 1000 µS pulses repeated every 60 Hz cycle for about eight to about twelve (positive half-cycles) cycles at about 65 A to about 140 A peak current, with about 800 µS, about eight cycles and about 100 A peak current being preferred.

Although a microprocessor-based timer routine 230 is shown, the invention is applicable to any suitable timing mechanism or circuit (e.g., without limitation, an electromechanical timer, a mechanical timer, an electronic timer with a relay contact output, an electronic timer with a solid state output, an analog and/or digital circuit timer).

Although a microprocessor 50 is shown, the invention is applicable to a wide range of processor-based circuits, such as, for example, without limitation, analog, digital, analog/digital, digital/processor, analog/processor, and/or various combinations thereof.

While for clarity of disclosure reference has been made herein to display circuits, such as 52,54,56, for displaying power circuit information, it will be appreciated that such information may be stored, printed on hard copy, be computer modified, be combined with other data, and/or be communicated for local and/or remote computation and/or display. All such processing shall be deemed to fall within the terms "display" or "displaying" as employed herein.

The exemplary circuit analyzer 2 reliably determines if an AFCI device, a GFCI device for people protection, or a GFCI device for equipment protection is attached to the power circuit 29 (e.g., for an outlet or receptacle, such as 31). For example, if an electrician installs an arc fault circuit breaker in a branch circuit, then the circuit analyzer 2 may be employed by the electrician or another inspector, in order to verify that the corresponding outlet or receptacle, such as 31, is suitably protected.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. Apparatus for testing a power circuit including an earth leakage ground fault circuit interrupter, a receptacle, and a line, a neutral and a ground electrically connected between said circuit interrupter and said receptacle, said apparatus comprising:
    means for inputting at least one test request;
    means for outputting at least one test signal responsive to said at least one test request;
    means for selectively providing a load between said line and said neutral responsive to one of said at least one test signal; and
    a display confirming tripping of said ground fault circuit interrupter responsive to said load, in order to determine if said neutral is electrically connected to said ground between said circuit interrupter and said receptacle.

2. The apparatus of claim 1 wherein said means for inputting includes at least one pushbutton.

3. The apparatus of claim 1 wherein said means for selectively providing includes a triac electrically connected in series with a resistor between said line and said neutral, said triac being responsive to said one of said at least one test signal.

4. The apparatus of claim 3 wherein said triac includes an optically isolated input, which receives said one of said at least one test signal from said means for outputting.

5. The apparatus of claim 1 wherein said one of said at least one test signal is a first test signal; and wherein said means for outputting includes means for disabling a second test signal for a predetermined time after output of said first test signal.

6. The apparatus of claim 5 wherein said means for outputting includes means for displaying when said second test signal is not disabled.

7. The apparatus of claim 5 wherein said power circuit includes an alternating current waveform having a plurality of line cycles; and wherein said means for outputting includes means for outputting said one of said at least one test signal for a predetermined count of said line cycles.

8. The apparatus of claim 7 wherein said predetermined count is about four line cycles.

9. The apparatus of claim 5 wherein said predetermined time is about two seconds.

10. The apparatus of claim 1 wherein said means for selectively providing includes an impedance providing about a 0.25 ampere load between said line and said neutral.

11. The apparatus of claim 1 wherein said means for selectively providing includes means for providing at least one of a ground fault test, an arc fault test and an earth leakage test for said power circuit.

12. The apparatus of claim 11 wherein said means for inputting includes a plurality of pushbuttons for inputting a plurality of test requests for said ground fault test, said arc fault test, said earth leakage test and a shared ground/neutral test for said power circuit.

13. The apparatus of claim 1 wherein said display includes means for displaying whether said line, said neutral and said ground are properly electrically connected between said circuit interrupter and said receptacle.

14. The apparatus of claim 13 wherein said means for displaying includes a plurality of LEDs for displaying correct and incorrect electrical connections between said circuit interrupter and said receptacle.

15. The apparatus of claim 14 wherein said LEDs display a first state for said line and said ground being reversed between said circuit interrupter and said receptacle, a second state for said line and said neutral being reversed between said circuit interrupter and said receptacle, a third state for said ground being open between said circuit interrupter and said receptacle, a fourth state for said neutral being open between said circuit interrupter and said receptacle, and a fifth state for said line being open between said circuit interrupter and said receptacle.

16. The apparatus of claim 1 wherein said means for selectively providing includes a triac electrically connected in series with a resistor between said line and said ground, said at least one test signal including at least a first test signal and a second test signal, said triac being responsive to one of said first and second test signals.

17. The apparatus of claim 16 wherein said triac includes an optically isolated input, which receives said one of said first and second test signals from said means for outputting.

18. The apparatus of claim 16 wherein said triac and said resistor provide a load of about 40 mA for an earth leakage test.

19. The apparatus of claim 16 wherein said triac and said resistor provide a load of about 8 mA for a ground fault test.

20. The apparatus of claim 1 wherein said means for inputting includes a first test request and a second test request as said at least one test request; wherein said means for selectively providing includes a transistor electrically connected in series with a resistor and a diode between said line and said neutral, said at least one test signal including a first test signal and a second test signal, said transistor being responsive to one of said first and second test signals, said transistor and said resistor providing a current of about 65 to about 140 peak amperes; and wherein said means for outputting outputs said first and second test signals responsive to said first and second test requests, respectively, said means for outputting providing said one of said first and second test signals having about eight to about twelve pulses, said pulses having a pulse width of about 700 $\mu$S to about 1000 $\mu$S.

21. The apparatus of claim 20 wherein said power circuit includes an alternating current waveform having a plurality of line cycles; wherein said means for outputting includes means for detecting a signal between said line and said neutral having a zero crossing, a processor having an interrupt responsive to said signal between said line and said neutral, said processor including an interrupt service routine detecting the zero crossing of said signal between said line and said neutral, said interrupt service routine delaying for a portion of one of said line cycles, activating said first test signal, delaying for about 800 $\mu$S, and de-activating said first test signal.

22. Apparatus for testing a power circuit including an arc fault circuit interrupter, a receptacle, and a line and a neutral electrically connected between said circuit interrupter and said receptacle, said apparatus comprising:

means for inputting at least one test request;

means for outputting at least one test signal responsive to said at least one test request, one of said at least one test signal having about eight to about twelve pulses, said pulses having a pulse width of about 700 $\mu$S to about 1000 $\mu$S;

means for selectively providing a load between said line and said neutral responsive to said one of said at least one test signal, said load providing a current of about 65 to about 140 peak amperes; and a display confirming tripping of said arc fault circuit interrupter responsive to said load and said one of said at least one test signal.

23. The apparatus of claim 22 wherein said means for inputting includes a first test request and a second test request as said at least one test request; wherein said means for selectively providing includes a transistor electrically connected in series with a resistor and a diode between said line and said neutral, said at least one test signal including a first test signal and a second test signal, said transistor being responsive to one of said first and second test signals, said transistor and said resistor providing said load, and wherein said means for outputting outputs said first and second test signals responsive to said first and second test requests, respectively.

24. The apparatus of claim 23 wherein said power circuit includes an alternating current waveform having a plurality of line cycles; wherein said means for outputting includes means for detecting a signal between said line and said neutral having a zero crossing, a processor having an interrupt responsive to said signal between said line and said neutral, said processor including an interrupt service routine detecting the zero crossing of said signal between said line and said neutral, said interrupt service routine delaying for a portion of one of said line cycles, activating said one of said first and second test signals, delaying for about 800 $\mu$S, and de-activating said one of said first and second test signals.

25. A method for testing a power circuit including an earth leakage ground fault circuit interrupter, a receptacle, and a line, a neutral and a ground electrically connected between said circuit interrupter and said receptacle, said receptacle receiving a line-to-neutral voltage from said circuit interrupter, said method comprising:

inputting at least one test request;

outputting at least one test signal responsive to said at least one test request;

selectively providing a load between said line and said neutral responsive to one of said at least one test signal; and determining loss of said line-to-neutral voltage from said circuit interrupter responsive to said load, in order to determine that said neutral is electrically connected to said ground between said circuit interrupter and said receptacle.

* * * * *